United States Patent [19]
Chen et al.

[11] Patent Number: 5,946,234
[45] Date of Patent: Aug. 31, 1999

[54] CONSTANT CURRENT SOURCE PROGRAMMING OF ELECTRICALLY PROGRAMMABLE MEMORY ARRAYS

[75] Inventors: Jian Chen, San Jose; Lee Cleveland, Santa Clara, both of Calif.

[73] Assignee: Advanced Micro Devices, Inc., Sunnyvale, Calif.

[21] Appl. No.: 08/993,555

[22] Filed: Dec. 18, 1997

[51] Int. Cl.[6] .................................................. G11C 7/00
[52] U.S. Cl. .............................. 365/185.18; 365/185.14; 365/185.24
[58] Field of Search ........................ 365/185.18, 185.24, 365/185.33, 185.14

[56] References Cited

U.S. PATENT DOCUMENTS

| | | | |
|---|---|---|---|
| 5,095,344 | 3/1992 | Harari | 357/23.5 |
| 5,200,959 | 4/1993 | Gross et al. | 371/21.6 |
| 5,270,979 | 12/1993 | Harari et al. | 365/218 |
| 5,297,148 | 3/1994 | Harari et al. | 371/10.2 |
| 5,313,421 | 5/1994 | Guterman et al. | 365/185 |
| 5,359,558 | 10/1994 | Chang et al. | 365/189.07 |
| 5,396,468 | 3/1995 | Harari et al. | 365/218 |
| 5,691,940 | 11/1997 | Marshall et al. | 365/185.24 |
| 5,818,761 | 10/1998 | Onakado et al. | 365/185.13 |

*Primary Examiner*—Vu A. Le
*Attorney, Agent, or Firm*—Foley & Lardner; Jefferson Perkins

[57] ABSTRACT

A constant current pulse of predetermined width and variable voltage is used to program a selected cell in an array of EEPROM cells.

15 Claims, 3 Drawing Sheets

CONSTANT CURRENT SOURCE PROGRAMMING OF ELECTRICALLY PROGRAMMABLE MEMORY ARRAYS

TECHNICAL FIELD OF THE INVENTION

The present invention relates to methods and apparatus for the programming of electrically programmable memory cells, and more particularly to a method and apparatus for delivering a predetermined charge to the floating gate of an electrically erasable and programmable (EEPROM) cell.

BACKGROUND OF THE INVENTION

The programming or erasure of a floating gate memory cell, in current practice, is done by applying different voltage pulses to the different nodes of the transistor: source, drain substrate and/or control gate. After each such programming or erase pulse, a verify step is executed to check the threshold voltage $V_t$ of the channel region of the cell. If the programming of the cell is not verified, another pulse is applied; this iteration of applying a programming pulse and verifying continues until a positive verification is returned.

There are at least two drawbacks to this conventional practice. The first is the amount of time it takes to execute a verify step. The other is that if the pulse voltage, which typically is of a predetermined amount, is too high, the cell will be overprogrammed or overerased because of overcharging or overdischarging. Cells storing overcharged or overdischarged bits can cause several kinds of functional and reliability problems, and are to be avoided if at all possible.

An analogy can be drawn from practices concerning the vending of coffee. According to a first method, one simply pours coffee from the pot into the mug while watching the mug; when the mug is nearly full, the person pouring the coffee stops.

According to a second coffee vending method, a coffee vending machine is involved. A button is pushed, and a uniform volumetric delivery of coffee takes place. This is for a coffee mug of a predetermined size.

A third method of obtaining coffee is analogous to present EEPROM programming practice: take an empty cup, close your eyes, pour in a spoonful of coffee, open your eyes, see if the cup is full; if the cup is not yet full, close your eyes again and pour in another spoonful of coffee. Open your eyes again to check if the cup is full and repeat until the cup is full. If the fill-and-check process is repeated too many times, the last spoonful of coffee will cause the coffee mug to overflow. To obviate this problem, a small spoon must be used, but this increases the chances that two or more check-and-fill iterative steps will be needed. If greater speed is desired, the spoon size is increased, but this increases the "overprogramming" problem.

In the above methods of getting coffee, according to the first method one is really "verifying" while at the same time "programming". According to the second method, a verify mode is not necessary because the user knows exactly how much coffee is vended in advance. The third method is not used by anyone for coffee at all; unfortunately, it is still being used for the programming of flash EEPROM memory devices.

Therefore, a need exists for a method and apparatus for programming an electrically programmable memory cell, and particularly an electrically erasable and programmable memory cell, which avoids the dangers of over-and under-programming.

SUMMARY OF THE INVENTION

The present invention solves this problem by delivering a predetermined amount of charge to a preselected node of a selected electrically programmable memory cell. The predetermined amount of charge is obtained by connecting a constant current source to the node of the cell for a predetermined period of time. Preferably, this node is a control gate of the cell, which delivers charge to a floating gate of the cell through a thin insulator layer by Fowler-Nordheim tunneling. A cell programmed according to this invention does not require a thin tunnel oxide between the channel region of the cell and its floating gate; instead, the insulator layer between the control gate and the floating gate is made substantially thinner than the gate insulator between the floating gate and the channel region. No electrons move from the source or drain of the EEPROM cell to the floating gate; in the programming method according to the invention, both the source and the drain are held at 5 volts or some other predetermined voltage, while the sources and drains of the nonselected cells are held at a substantially lower voltage, such as 0 volts. This programming method decreases write disturb problems.

Because a predetermined amount of charge has been delivered to the control gate, and because this predetermined amount of charge is directly related to the amount of charge which will then reside on the floating gate, it is possible to exactly meter an amount of charge to the floating gate. This obviates the need of a programming pulse/verify iteration and prevents overprogramming by applying a fraction too many programming voltage pulses. Instead, the programming voltage is allowed to vary while a constant current flows to the control gate. In a similar manner, application of a positive pulse from a constant current source may be used to erase a previously programmed cell without overerasing problems.

BRIEF DESCRIPTION OF THE DRAWINGS

Further aspects of the invention and their technical advantages may be discerned by referring to the following detailed description, when taken in conjunction with the drawings, in which like characters identify like parts and in which.

DETAILED DESCRIPTION OF THE INVENTION

Figure 1:
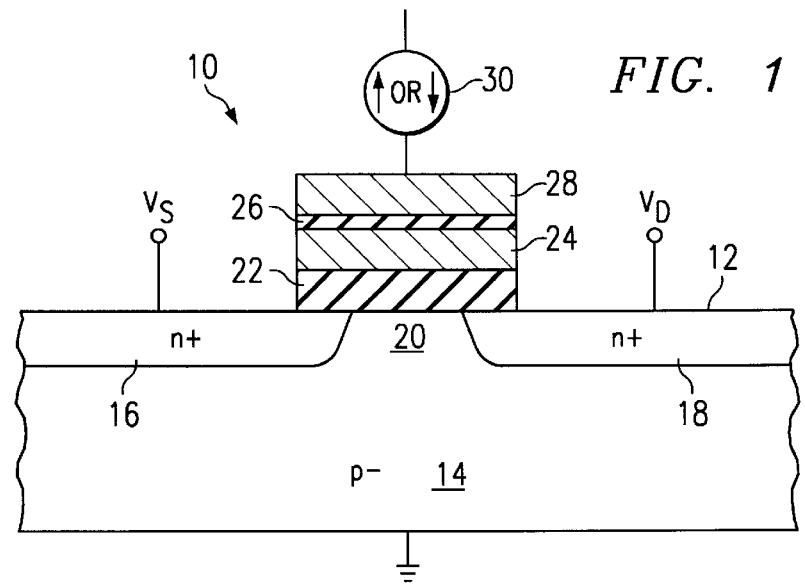
FIG. 1 is a highly schematic cross-sectional view showing an electrically erasable, programmable memory cell according to the invention.

In FIG. 1, a representative EEPROM cell according to the invention is indicated generally at 10. The cell 10 is formed at a face 12 of a semiconductor layer 14 of a first conductivity type, such as (p). It should be understood that whereas an n-channel EEPROM cell is shown, a p-channel EEPROM cell could as easily be constructed by reversing the indicated conductivity types. The semiconductor layer 14 is tied to ground as shown and is lightly doped.

An (n+) source region 16 and an (n+) drain region 18 are spaced apart by a (p) channel region 20. Above the channel region 20 is disposed a first insulator layer 22 that may be formed of oxide or the like. This first insulating layer 22 spaces a conductive floating gate 24 from the channel region 20. A thinner layer 26 of insulating material is grown on the floating gate 24 and spaces the floating gate 24 from a conductive control gate 28. Gates 24 and 28 may be patterned and etched from respective layers of highly doped polycrystalline silicon (poly).

As indicated schematically at 30, the programming method and apparatus of the invention connects a negative current source to the control gate 28 during programming and a positive current source to the control gate 28. In programming, electrons are passed from the control gate 28 to the floating gate 24 by preferably Fowler-Nordheim tunneling, and thus the insulating layer 26 is relatively thin, such as on the order of 100 angstroms. Because no tunneling takes place across the insulator layer 22, it can be made to be relatively thicker and more robust, for example, 200 angstroms. The present invention confers a technical advantage in that because a thicker oxide layer can be used, no oxide/nitride/oxide (ONO) fabrication module need be used in forming the insulating layer 22; optionally, such an ONO module can be used in forming the insulating layer 26.

Outside of the unusual gate insulator layer thicknesses, the structure of cell 10 and its method of fabrication are conventional. In one fabrication sequence, after isolation of an active device area by a LOCOS oxide process or the like, gate insulator layer 22 may be grown on the surface 12 of the semiconductor layer 14; $V_t$ adjust and punch-through implants may be performed through insulator layer 22 or through a prior sacrificial oxide layer (not shown) to influence the characteristics of channel region 20; a poly 1 layer may be deposited, and patterned and etched in one direction, an ONO layer grown, and a poly 2 layer may be deposited thereafter, followed by a stack etch to complete the definition of the floating gate 22 and the control gate 28; and a self-aligned implant may be subsequently performed to create source region 16 and drain region 18.

As is also schematically shown in FIG. 1, the source 16 is connected to a source voltage $V_S$, while the drain 18 is connected to a drain voltage $V_D$.

Figure 2A:
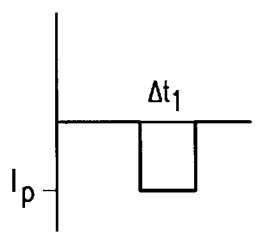
FIG. 2a is a graph of current versus time showing the characteristics of a constant-current pulse used in programming the cell shown in FIG. 1.

FIG. 2a is a current/time diagram showing a representative constant current pulse to be applied to the control gate 28 shown in FIG. 1. A negative programming current $I_p$ has a magnitude that is measured in the picoamperes, such as 0.1 picoamperes. It is applied as a square wave pulse with a width $\Delta t$ in the range of 10 nsec to 1000 nsec, and preferably 100 nsec. The charge delivered to the control gate is the area under the pulse curve. While the current is held constant, the voltage may be allowed to vary. Supplying a constant current over a predetermined period of time meters a predetermined amount of charge to the control gate 28, which charge is transferred at least in large part to the floating gate 24. The present invention therefore permits a predetermined amount of charge to reside in the floating gate 24 and avoids a subsequent "verified" mode.

Figure 3:
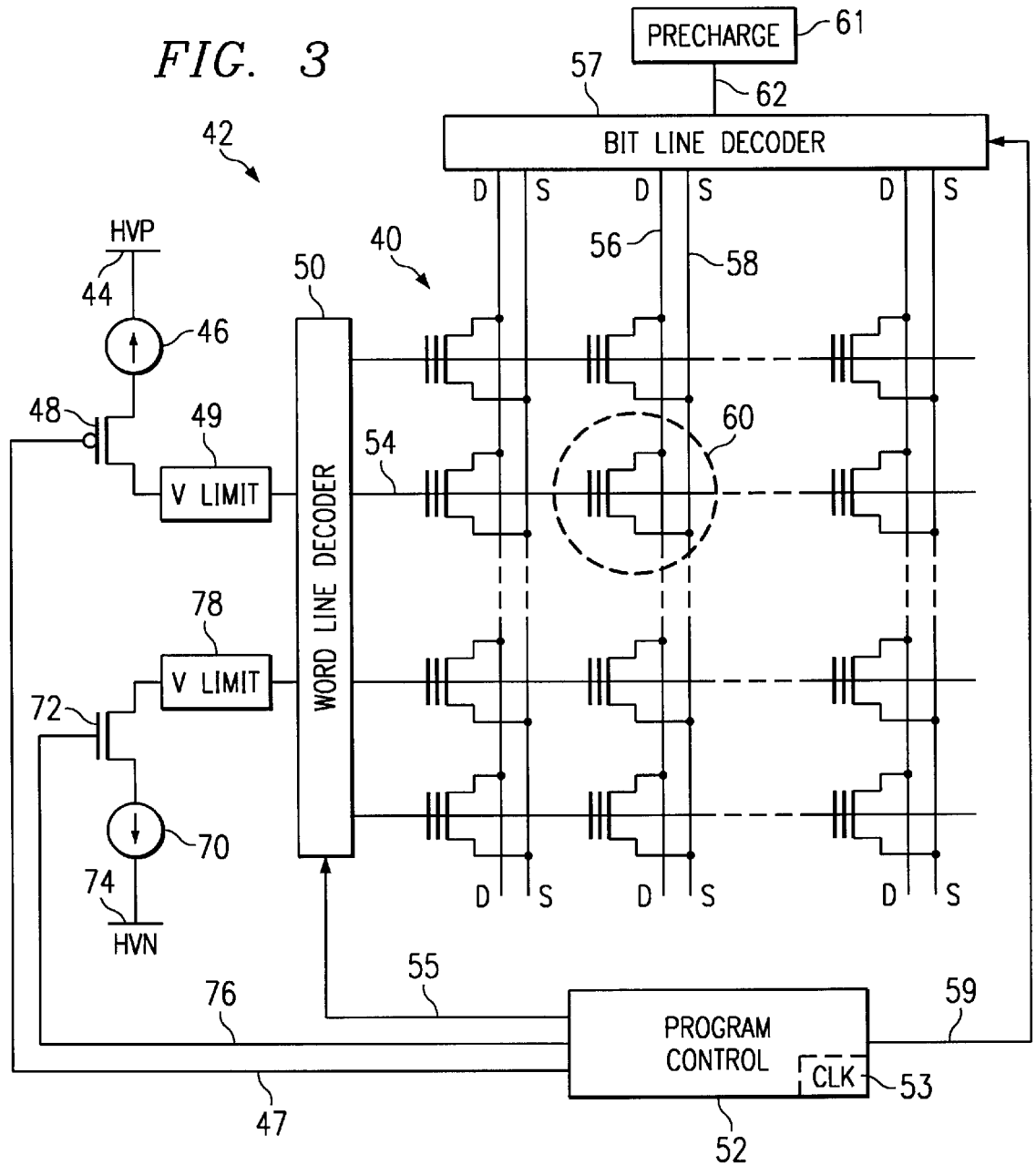
FIG. 3 is a schematic electrical diagram of a NOR array of EEPROM cells and also showing circuitry for delivering a predetermined charge to a selected one of the cells.

FIG. 3 is an electronic schematic diagram of an array indicated generally at 40 connected to a programming circuit indicated generally at 42. Connected to a high positive such as HVP at 44, a constant current device 46 has its other end connected in series through a current path of a control transistor 48 and a voltage limiting circuit 49 to a word line decoder 50. HVP may, for example, be +10 V. The voltage limiting circuit 49 allows the programming pulse to vary within predetermined limits, such as 5 to 10 volts, and may for example comprise a Zener diode. A programming control circuit indicated schematically at 52 energizes the gate of p-channel transistor 48 through a control line 47 for a predetermined amount of time equivalent to $\Delta t1$ as shown in FIG. 2a; the predetermined amount of time is derived from a clock subcircuit 53 of the program control circuit 52.

The square wave current pulse is fed to a word line decoder circuit 50 which, responsive to an address present on control path 55 from program control circuit 52, selects a particular word line 54 out of a plurality of such word lines in the array. During a programming mode, while the selection of a particular word line 54 is being performed by the address module 50, a particular drain column line 56 and a source column line 58 are being selected by a bit line decoder 57, according to an address on a bit line decoder control path 59 connected to program control circuit 52. Both the drain and the source of each cell on the column lines 56, 58 are held at a predetermined voltage, such as 5 volts; the drains and sources of the remaining cells in the array are held at a voltage which is substantially lower than that of the column containing the cell to be programmed, such as 0 volts. A precharge circuit 61 is connected via a path 62 to the bit line decoder 57 to supply a 5 V voltage to the decoded column line pair. Once a particular selected cell 60 (indicated by a dashed circle) has been programmed, no verify mode need be subsequently executed, and instead the circuitry can move on to a subsequent cell to be programmed.

Figure 2B:
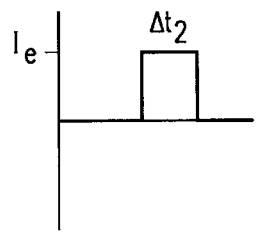
FIG. 2b is a graph of current versus time showing the characteristics of a constant-current pulse used in erasing the cell shown in FIG. 1.

The same method may be used in erasing the floating gate, with a constant current source being directed in the other direction in this instance. In FIG. 3, for example, a constant current source 70 is connected between the drain of a source of an n-channel field effect transistor 72 and a negative voltage such as HVN (74). HVN can, for example, be −10 V. A gate of the switching transistor 72 is controlled by a control line 76, which in turn is connected to the program controller 52. A voltage limiting circuit 78 is interposed in series between the drain of the transistor 72 and the word line decoder 50, and places limits on the voltage magnitude of the negative current pulse created by the constant current source 70 once the same is connected to a selected word line, such as word line 54. When this happens, a current pulse as shown in FIG. 2b will result and the selected cell 60 will be effectively erased, once again without the necessity of entering into any verify mode.

Figure 5:
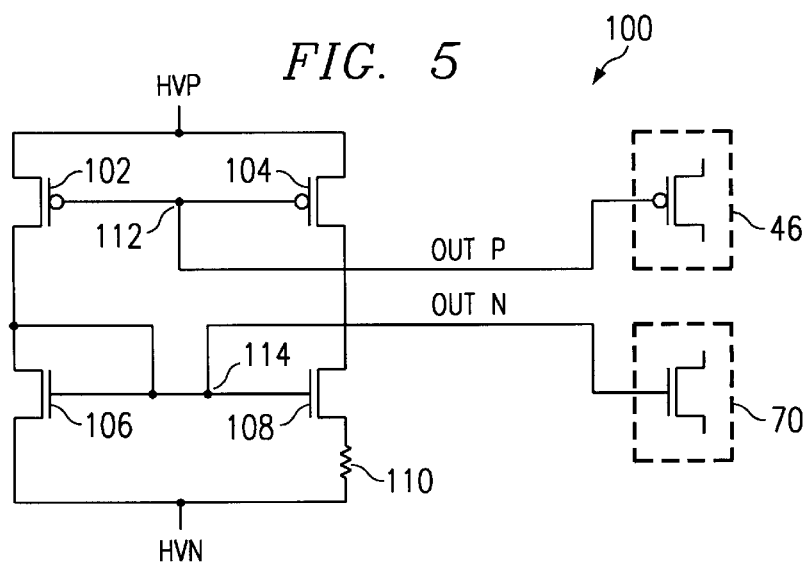
FIG. 5 is a current source circuit for use with the arrays illustrated in FIGS. 3 and 4.

FIG. 5 is a schematic diagram of a constant current circuit for use according to the invention. A Widlar current source circuit is indicated generally at 100. This current source circuit includes a pair of p-channel field effect transistors 102 and 104 having their drains connected to HVP, which as previously explained can be +10 volts. A source of the transistor 102 is connected to a drain and to a gate of an n-channel field effect transistor 106. A source of the p-channel transistor 104 is connected to a drain of an n-channel field effect transistor 108. A source of transistor 106 is connected to HVN, which can be −10 volts. HVN is connected to a source of the transistor 108 through a resistor 110.

An OUTP node 112 is connected to the gates of both p-channel transistors 102 and 104, while an OUTN node 114 is connected to the gates of both n-channel transistors 106 and 110. The OUTP signal is furnished to the gate of current source device 46, which can be a p-channel field effect transistor as shown. Similarly, the OUTN signal is connected to the gate of an n-channel transistor 70, corresponding to the current source 70 shown in FIGS. 3 and 4. The devices 46 and 70 effectively act as current mirrors of the OUTP and OUTN signals.

Figure 4:
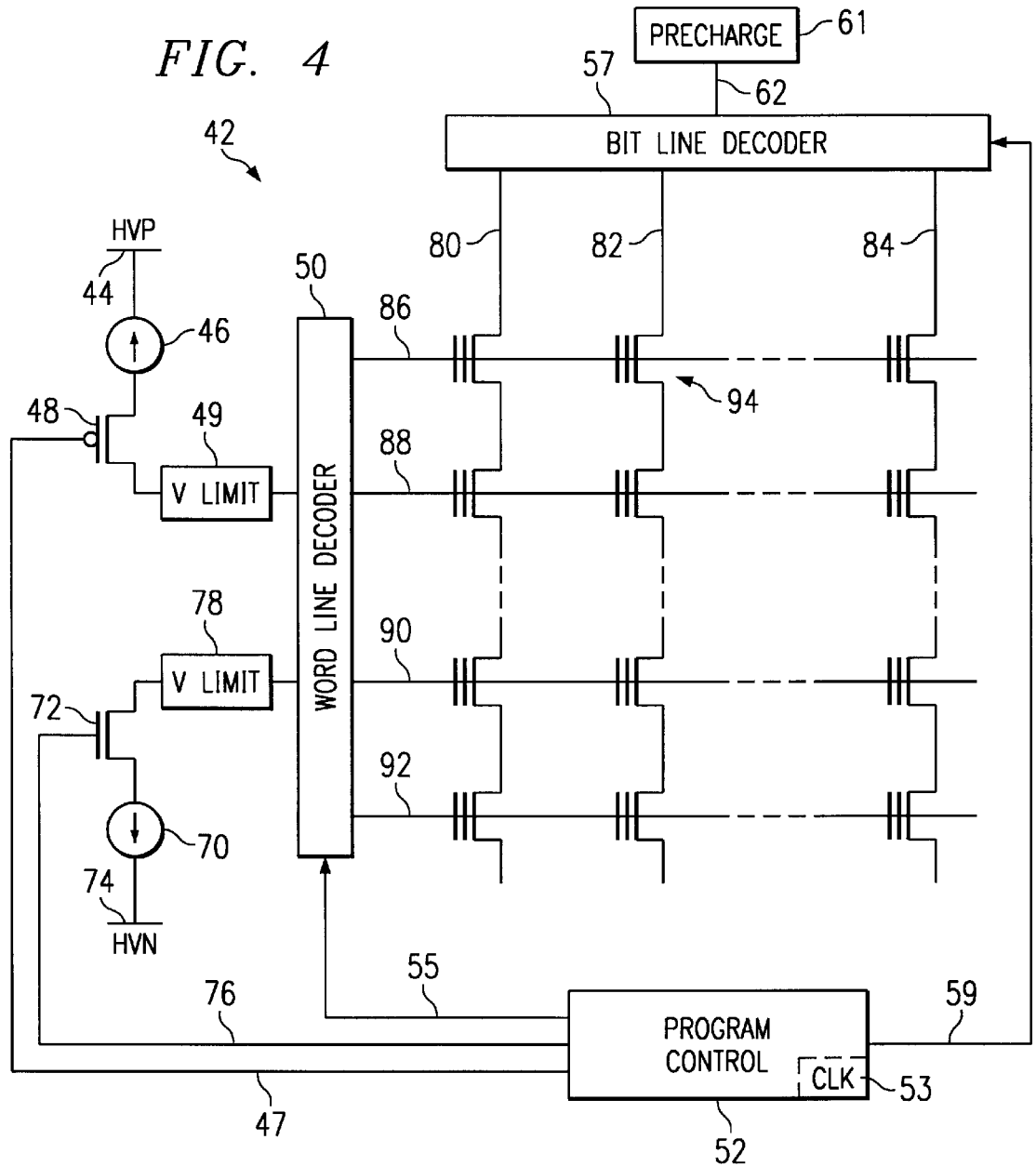
FIG. 4 is a similar array of EEPROM cells connected in a NAND configuration.

A NOR array of cells, as is shown in FIG. 3, is indicated where speed or random access are considerations. A NAND array, such as the one shown in FIG. 4, is indicated where mass storage is desired. In FIG. 4, the programming circuitry is indicated generally at 42. Between FIGS. 3 and 4, like characters identify like parts. In a NAND array, each column of cells is connected in series to a single bit line such as bit lines 80, 82 and 84, with each row of EEPROM cells having its cell control gates connected to a word line, such as word lines 86, 88, 90 or 92. A particular cell to be programmed, such as cell 94, is selected by placing a positive voltage on its word line (here, 86), deselecting the other bit lines (here, 80 and 84) by placing a positive voltage on them, and holding bit line 82 at ground. Erasure takes place along opposite lines: assuming cell 94 is to be erased, a negative voltage is placed on word line 86, and deselected bit lines 80 and 84, and selected bit line 82 is held at ground.

The illustrated method of charging or discharging the floating gate cell inhibits the "disturb" of other bits in the array, as the sources are held to the same level as the drains.

Because the present invention eliminates bottom channel hot electron injection and field edge discharge as programming problems, the source/drain medium doped drain (MDD) overlap for the cells need not be large; this graded diffusion of the source and drain can be relatively small, making scaling of the cell easier.

In summary, a method and apparatus for programming a selected cell in an array of electronically programmable memory cells has been shown and described, whereby a constant-current pulse is capable of delivering a predetermined, metered amount of charge to the control gate for the cell, as by tunneling to the floating gate. While illustrated embodiments of the above invention and their advantages have been described in the above detailed description, the invention is not limited thereto but only by the scope and spirit of the appended claims.

We claim:

1. Apparatus for programming a cell selected from an array of electrically programmable memory cells, each cell in the array having a control gate, the apparatus comprising:

a constant current source having an output for delivering a constant current;

circuitry for selectively connecting said constant current source to the control gate of a selected cell; and a timer for actuating said circuitry during a predetermined period, such that a predetermined amount of charge is delivered to the control gate.

2. The apparatus of claim 1, and further comprising circuitry coupled to said constant current source for permitting the voltage applied to the control gate during programming to vary within predetermined limits.

3. The apparatus of claim 1, wherein each cell in said array has a source region and a drain region, a channel region spacing said source region from said drain region, said apparatus further comprising circuitry for holding a source region and a drain region of said selected cell to a single predetermined voltage while said constant current source is connected to said control gate.

4. The apparatus of claim 3, wherein said predetermined voltage is five volts.

5. The apparatus of claim 3, and further comprising circuitry for holding source and drain regions of nonselected ones of said cells at a voltage substantially lower than said single predetermined voltage while said constant current source is connected to said control gate.

6. The memory of claim 5, wherein said predetermined structural component is a control gate of said selected one of said cells.

7. A method of programming a selected cell to be programmed in an array of electrically programmable memory cells, comprising:

connecting a constant current source to a control gate of the selected cell for a predetermined period of time; and delivering a predetermined amount of charge to the control gate during said period of time while permitting the voltage applied to the control gate to vary.

8. The method of claim 7, and further comprising the step of permitting the voltage applied to the control gate during programming to vary within predetermined limits.

9. The method of claim 7, and further comprising the step of holding a source region and a drain region of said selected cell at a single predetermined voltage during said step of delivering the predetermined amount of charge.

10. The method of claim 9, wherein said predetermined voltage is five volts.

11. The method of claim 9, and further comprising the step of holding source and drain regions of nonselected ones of said cells at a voltage substantially lower than said single predetermined voltage during said step of delivering the predetermined amount of charge.

12. An electrically programmable memory comprising:

an array of memory cells; and a programming circuit connectable to a selected one of the memory cells for programming the selected one of the cells, the programming circuit including a constant current source for selective connection to a control gate of the selected one of the memory cells.

13. The memory of claim 12, wherein said constant current source has an output, a timer of said programming circuit selectively connecting said output to said selected cell for a predetermined time, such that a predetermined amount of charge will be delivered to said control gate of said selected cell.

14. The memory of claim 12, and further comprising an erasing circuit connectable to a selected one of said cells for erasing said selected one of said cells, said erasing circuit including a constant current source for selected connection to a predetermined structural component of said selected one of said cells.

15. An electrically programmable memory comprising:

an array of memory cells;

a programming circuit connectable to a selected one of the memory cells for programming the selected one of the cells, the programming circuit including a constant current source for selective connection to a control gate of the selected one of the memory cells; and an erasing circuit connectable to a selected one of the cells for erasing the selected one of the cells, the erasing circuit including a constant current source for selected connection to a predetermined structural component of the selected one of the cells.

* * * * *